US012727497B2

(12) United States Patent
Okamoto

(10) Patent No.: US 12,727,497 B2
(45) Date of Patent: Sep. 1, 2026

(54) MEMORY TILE WITH PROBE PAD ARRANGEMENT AND STACKED MEMORY DEVICE

(71) Applicant: Powerchip Semiconductor Manufacturing Corporation, Hsinchu (TW)

(72) Inventor: Takeo Okamoto, Osaka (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 399 days.

(21) Appl. No.: 18/473,323

(22) Filed: Sep. 25, 2023

(65) Prior Publication Data

US 2025/0105123 A1 Mar. 27, 2025

(51) Int. Cl.

*H10W 70/65* (2026.01)
*H10P 74/00* (2026.01)
*H10W 70/685* (2026.01)
*H10W 90/00* (2026.01)
*H10W 80/00* (2026.01)

(Continued)

(52) U.S. Cl.

CPC ........... *H10W 70/65* (2026.01); *H10P 74/273* (2026.01); *H10W 70/685* (2026.01); *H10W 90/00* (2026.01); *H10W 80/721* (2026.01); *H10W 90/26* (2026.01); *H10W 90/297* (2026.01); *H10W 90/732* (2026.01); *H10W 90/734* (2026.01); *H10W 90/794* (2026.01)

(58) Field of Classification Search

None

See application file for complete search history.

(56) References Cited

U.S. PATENT DOCUMENTS 8,957,691 B2 2/2015 Wang et al.
2002/0180026 A1* 12/2002 Liu .................... G01R 31/2884 257/773

(Continued)

FOREIGN PATENT DOCUMENTS

| | | |
|---|---|---|
| TW | 200710402 | 3/2007 |
| TW | 202134663 | 9/2021 |
| TW | 202301702 | 1/2023 |

OTHER PUBLICATIONS

"Office Action of Taiwan Counterpart Application", issued on Jun. 12, 2024, p. 1-p. 17.

*Primary Examiner* — Su C Kim

(74) *Attorney, Agent, or Firm* — JCIPRNET

(57) ABSTRACT

A memory tile with a probe pad arrangement and a stacked memory device are provided. The memory tile has a first and a second surfaces; a first probe pad set, having first probe pads and provided on the first surface; a second probe pad set, having second probe pads and provided on the second surface; first conductive connections, each of which is connected to a corresponding first probe pad; second conductive connections, each of which is connected to a corresponding first conductive connection; third conductive connections, each of which is connected to a corresponding second conductive connection; and fourth conductive connections, each of which is connected to a corresponding third conductive connection and to a corresponding second probe pad. The first and the second probe pad sets have the same arrangement pattern, and the same test signal pattern.

20 Claims, 6 Drawing Sheets

(51) Int. Cl.
*H10W 90/20* (2026.01)
*H10W 90/26* (2026.01)

(56) References Cited

U.S. PATENT DOCUMENTS

| | | | | |
|---|---|---|---|---|
| 2004/0036068 | A1* | 2/2004 | Li | H05K 3/4638<br>257/E23.069 |
| 2020/0212008 | A1 | 7/2020 | Kitano | |
| 2020/0386786 | A1* | 12/2020 | Kim | G01R 1/07342 |
| 2022/0216169 | A1 | 7/2022 | Song et al. | |
| 2022/0320044 | A1 | 10/2022 | Chuang et al. | |

* cited by examiner 110
112
stack
100
120
122

MEMORY TILE WITH PROBE PAD ARRANGEMENT AND STACKED MEMORY DEVICE

BACKGROUND

Technical Field

The disclosure relates to a test scheme for a memory device and particularly to a probe pad arrangement of a memory tile and a stacked memory device.

Description of Related Art

Stacked semiconductor devices are well developed. For example, as illustrated in FIGS. 1A and 1B, a stacked memory device, which comprises a logic chip 110 and a memory chip 120 stacked to each other, is available by wafer-on-wafer (WoW) and TSV (through-silicon via) technology. The stacked memory device 100 may be a stacked DRAM memory device, and a single control chip 110 with a memory controller 112 is stacked to the memory chip 120 in a face-to-face manner. The memory chip 120 includes a plurality of memory tiles 122 (such as MxN memory tiles 122), and a 4×2 configuration is shown as an example. Usually, the memory tiles 122 have the same structure and size.

The control chip 110 may be stacked onto the memory chip 120 to form the stacked memory device 100. In FIG. 1B, the TSV 124A is provided for signal transmission between the logic chip 110 to the memory chip, and the TSV 124B is provided for the memory tile 122. The logic chip 110 and the memory chip 120 can be boned through the metal pins 128. The memory tile 122 also provide internal wires (internal metal layers) 126 for providing interconnection.

In such structure, when the test engineer prepares to test the memory chip (memory wafer) using a probe card having 2 rows of probe needles. The surface of the memory tile 122 is provided with two rows of probe pads. Then, by making the two rows of probe needles touch the two rows of probe pads, the memory test may be performed. There are two test types, one is performed from the front side and the other is from the back side (after WoW process). It is necessary to provide two kinds of probe cards respectively for the front side test and the back side test.

However, this will increase the test cost, and there are needs to use one probe card that suitable for both of the front side test and the back side test.

SUMMARY

As described above, according to one embodiment of the disclosure, a memory tile with a probe pad arrangement of is provided. The memory tile comprises a first surface and a second surface opposite to the first surface; a first probe pad set, having a plurality of first probe pads and provided on the first surface; a second probe pad set, having a plurality of second probe pads and provided on the second surface; a plurality of first conductive connections, each of the plurality of first conductive connections is electrically connected to a corresponding first probe pad among the first probe pad set; a plurality of second conductive connections, each of the plurality of second conductive connections is electrically connected to a corresponding first conductive connection among the plurality of first conductive connections; a plurality of third conductive connections, each of the plurality of third conductive connections is electrically connected to a corresponding second conductive connection among the plurality of second conductive connections; and a plurality of fourth conductive connections, each of the plurality of fourth conductive connections is electrically connected to a corresponding third conductive connection among the plurality of third conductive connections and is electrically connected to a corresponding second probe pad among the second probe pad set. A first arrangement pattern of the first probe pad set is the same as a second arrangement pattern of the second probe pad set, and a first test signal pattern of the first probe pad set viewed from the first surface is the same as a second test signal pattern of the second probe pad set viewed from the second surface.

According to another embodiment of the disclosure, a stacked memory device is provided. The stacked memory device comprises a memory chip, having a plurality of memory tiles; and a logic chip, bonded to the memory chip in a face-to face manner and configured to control the memory chip. The memory tile comprises a first surface and a second surface opposite to the first surface; a first probe pad set, having a plurality of first probe pads and provided on the first surface; a second probe pad set, having a plurality of second probe pads and provided on the second surface; a plurality of first conductive connections, each of the plurality of first conductive connections is electrically connected to a corresponding first probe pad among the first probe pad set; a plurality of second conductive connections, each of the plurality of second conductive connections is electrically connected to a corresponding first conductive connection among the plurality of first conductive connections; a plurality of third conductive connections, each of the plurality of third conductive connections is electrically connected to a corresponding second conductive connection among the plurality of second conductive connections; and a plurality of fourth conductive connections, each of the plurality of fourth conductive connections is electrically connected to a corresponding third conductive connection among the plurality of third conductive connections and is electrically connected to a corresponding second probe pad among the second probe pad set. A first arrangement pattern of the first probe pad set is the same as a second arrangement pattern of the second probe pad set, and a first test signal pattern of the first probe pad set viewed from the first surface is the same as a second test signal pattern of the second probe pad set viewed from the second surface.

According to the embodiment, in the memory tile or the stacked memory device, a test signal pattern of the plurality of third conductive connections viewed from the first surface of the memory tile and a test signal pattern of the plurality of third conductive connections viewed from the second surface of the memory tile are a mirror symmetry.

According to the embodiment, in the memory tile or the stacked memory device, each of the plurality of first conductive connections is a redistribution layer, and each of the plurality of fourth conductive connections is a redistribution layer.

According to the embodiment, in the memory tile or the stacked memory device, each of the plurality of third conductive connections is a through silicon via (TSV).

According to the embodiment, in the memory tile or the stacked memory device, each of the plurality of second conductive connections is constructed by a least one internal metal layer provided in the memory tile.

According to the embodiment, in the memory tile or the stacked memory device, the plurality of first probe pads is arranged in two rows along a central line of the first arrangement pattern of the first probe pad set, and the plurality of second probe pads is arranged in two rows along a central line of the second arrangement pattern of the second probe pad set.

According to the embodiment, in the memory tile or the stacked memory device, the memory tile is a DRAM tile.

According to one embodiment of the disclosure, a memory tile with a probe pad arrangement of is provided. The memory tile comprises a first surface and a second surface opposite to the first surface; a first probe pad set, having a plurality of first probe pads and provided on the first surface; a second probe pad set, having a plurality of second probe pads and provided on the second surface; and a plurality of connection structures, each of the plurality of connection structures being electrically connected to a corresponding first probe pad among the plurality of first probe pads and to a corresponding second probe pad among the plurality of second probe pads. A first arrangement pattern of the first probe pad set is the same as a second arrangement pattern of the second probe pad set, and a first test signal pattern of the first probe pad set viewed from the first surface is the same as a second test signal pattern of the second probe pad set viewed from the second surface.

According to the embodiment, in the memory tile, each of the plurality of connection structures comprises: a first redistribution layer, electrically connected to the corresponding first probe pad; an interconnection, electrically connected to the first redistribution layer; a through silicon via (TSV), electrically connected to the interconnection; and a second redistribution layer, electrically connected to the corresponding second probe pad.

According to the embodiment, in the memory tile, the interconnection may comprise a plurality of internal metal layers provided in the memory tile.

According to the embodiment, in the memory tile, a test signal pattern of the TSVs viewed from the first surface of the memory tile and a test signal pattern of the TSVs viewed from the second surface of the memory tile are a mirror symmetry.

According to the embodiment, in the memory tile, the plurality of first probe pads is arranged in two rows along a central line of the first arrangement pattern of the first probe pad set, and the plurality of second probe pads is arranged in two rows along a central line of the second arrangement pattern of the second probe pad set.

According to the embodiment, in the memory tile, the memory tile is a DRAM tile.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
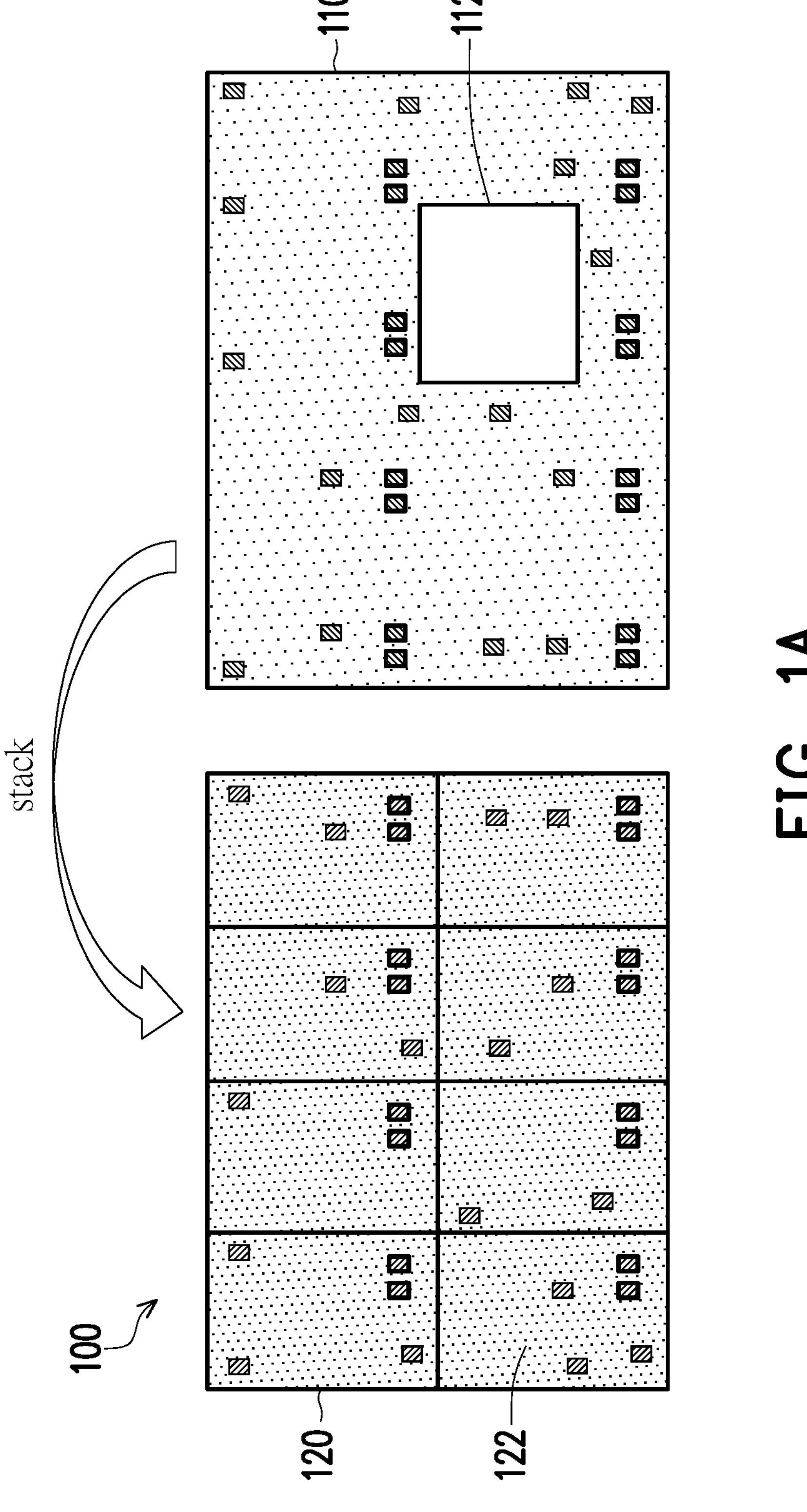
FIG. 1A illustrates a schematic structure of a stacked memory device.
Figure 1B:
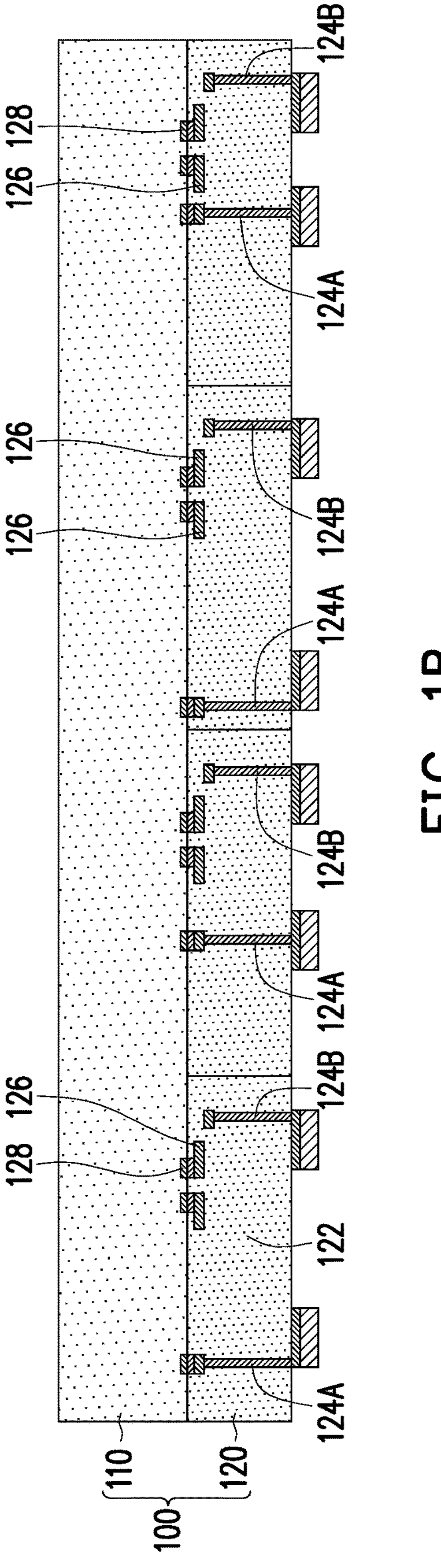
FIG. 1B illustrates a schematic cross-sectional view of the stacked memory device illustrated in FIG. 1A.
Figures 2A, 2B:
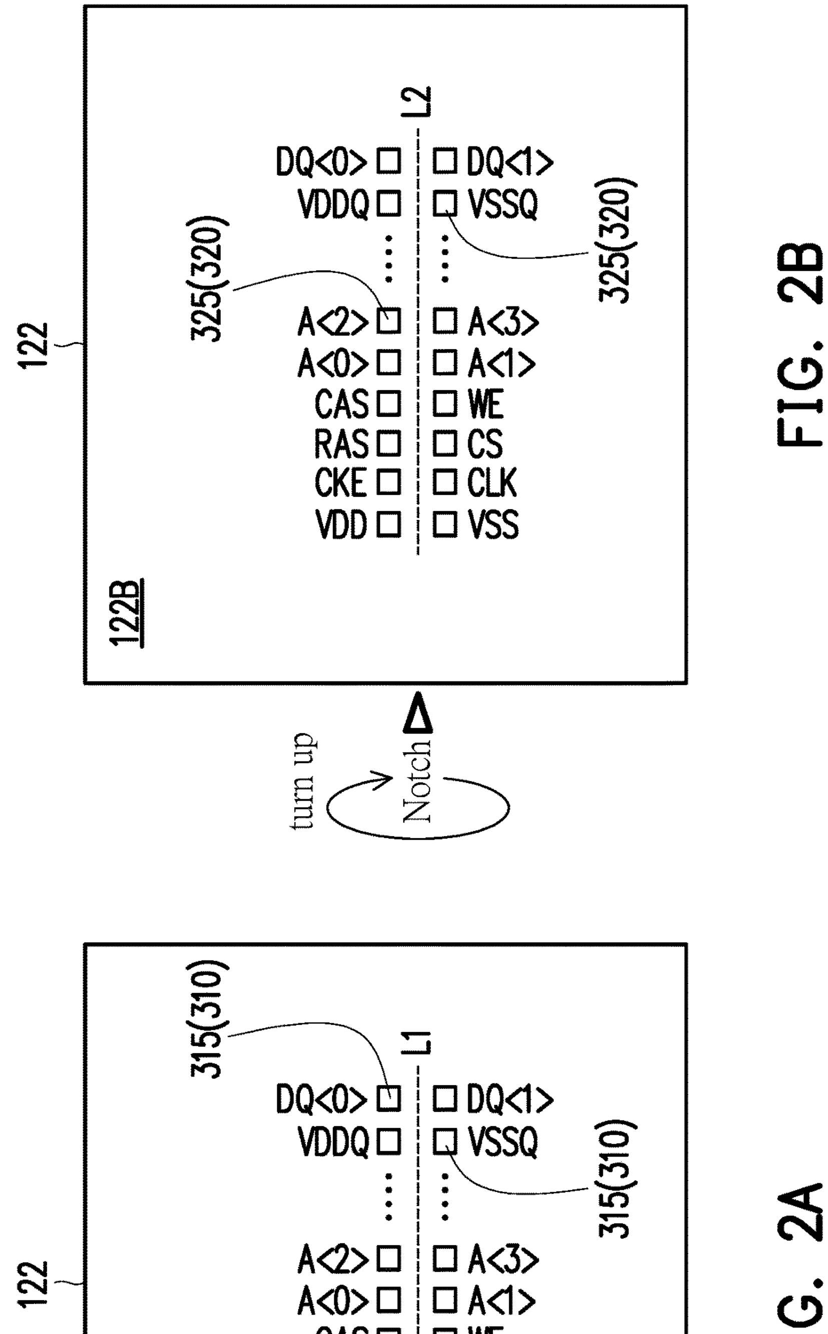
FIGS. 2A and 2B illustrate the arrangement pattern and test signal pattern of the probe pad set on the two surfaces of the memory tile.

FIGS. 2A and 2B illustrate the arrangement pattern and test signal pattern of the probe pad set on the two surfaces of the memory tile. Like the general configuration as shown in FIG. 1A, the memory chip 120 may comprises a plurality of memory tiles 122. The memory tiles 122 are provided on a wafer (not shown) like a tile arrangement. A certain number of the memory tiles 122 on the wafer may be cut off (forming the memory chip 120) according to a size of a logic chip 100 to which the cut memory tiles are stacked thereon to form a stacked memory device 100.

Each memory tile 122 in the memory chip 120 has a first surface 122A and a second surface 122B, and the second surface 122B is opposite to the first surface 122A, for example, in a parallel manner. Referring to FIGS. 2A and 2B, the memory tile 122 further comprises a first probe pad set 310 that has a plurality of first probe pads 315 and is provided on the first surface 122A (for example, the front surface). Similarly, the memory tile 122 further comprises a second probe pad set 320 that has a plurality of second probe pads 325 and is provided on the second surface 122B ((for example, the back surface). For simplicity, four first probe pads 315 (for receiving test signals of I/O data signals DQ<0>, DQ<1> and address signals A<0>, A<1>) and four second probe pads 325 (for receiving test signals of I/O data signals DQ<0>, DQ<1> and address signals A<0>, A<1>) are depicted. In FIGS. 2A and 2B, an example depicts two rows of the fist probe pads 315 on the first surface 122A and two rows of the second probe pads 325 on the second surface 122B. However, the fist probe pads 315 and the second probe pads 325 may be also arranged to have more rows (even rows).

The first probe pad set 310 and the second probe pad set 320 have the same arrangement pattern. For example, the arrangement pattern of the first probe pad set 310 has two rows of first probe pads 315 that are symmetrically lined up with respect to a central line L1 of the first probe pad set 310. The second probe pad set 320 has the same arrangement pattern as shown in FIGS. 2A and 2B, i.e., the arrangement pattern of the second probe pad set 320 has two rows of second probe pads 325 that are symmetrically lined up with respect to a central line L2 of the second probe pad set 320.

In addition, the first probe pad set 310 and the second probe pad set 320 have the same test signal pattern. As shown in FIG. 2A, when the memory tile 122 is viewed from the front side (the first surface 122A), the first probe pads 315 at the upper row are DQ<0>, VDDQ, . . . , A<2>, A<0>, CAS, RAS, CKE, VDD, and the first probe pads 315 at the lower row are DQ<1>, VSSQ . . . , A<3>, A<1>, WE, CS, CLK, VSS. In addition, as shown in FIG. 2B, when the memory tile 122 is viewed from the back side (the second surface 122B), the second probe pads 325 at the upper row are DQ<0>, VDDQ, . . . , A<2>, A<0>, CAS, RAS, CKE, VDD, and the second probe pads 325 at the lower row are DQ<1>, VSSQ . . . , A<3>, A<1>, WE, CS, CLK, VSS. Among the test signals, DQ<0>, DQ<1> are I/O data signals, A<0>, . . . , A<n> (n is an integer) are address signals, CAS, RAS, CKE, WE, CS, CLK, CKE are command signals, VSS, VDD, VDDQ, VSSQ are voltage signals, which are well defined in the DRAM specification.

Therefore, when the memory tile 122 (or wafer) is turned over, the test signal pattern of the first probe pad set 310 on the first surface 122A is the same as the test signal pattern of the second probe pad set 320 on the second surface 122B. Therefore, the same probe card can be applied to the probe pads on the two sides (first surface 122A and second surface 122B) of the memory tile 122.

According to the embodiment, in order to provide such test signal patterns of the first probe pad set 310 and the second probe set 320, a connection structure is provided between the first probe pad set 310 and the second probe set 320. The connection structure of the first probe pad set 310 and the second probe pad set 320 are described in detail.

Figure 3:
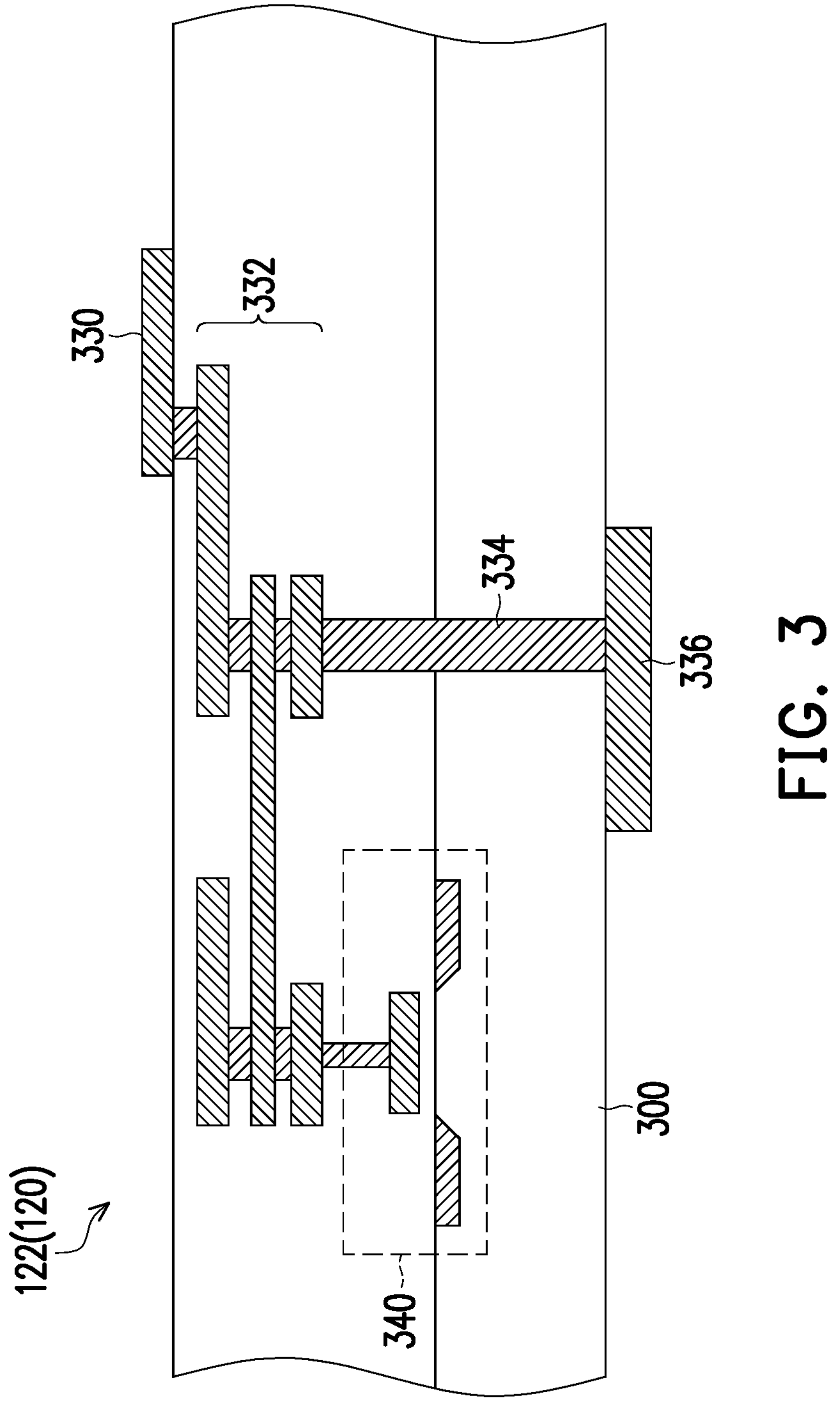
FIG. 3 illustrates a schematic cross-sectional view of a memory tile with a connection structure between two sets of probe pads on two surfaces of the memory tile according to one embodiment of the disclosure.
Figure 4B:
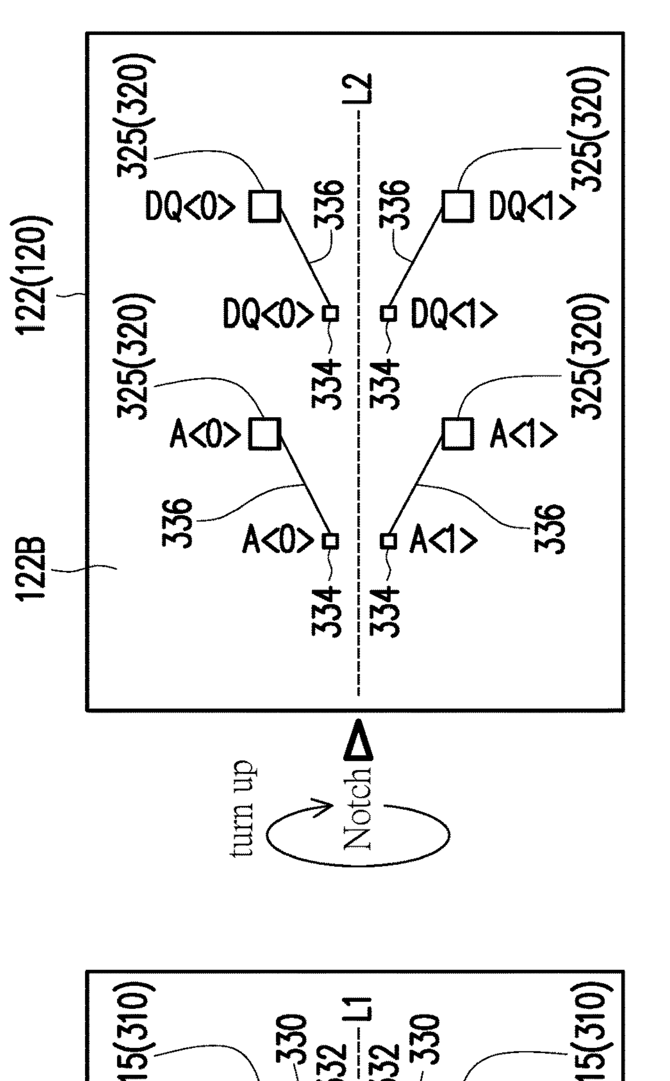
FIGS. 4A and 4B illustrate a schematic front view and back view of a memory tile with a connection structure between two sets of probe pads on two surfaces of the memory tile according to one embodiment of the disclosure.
Figure 4A:
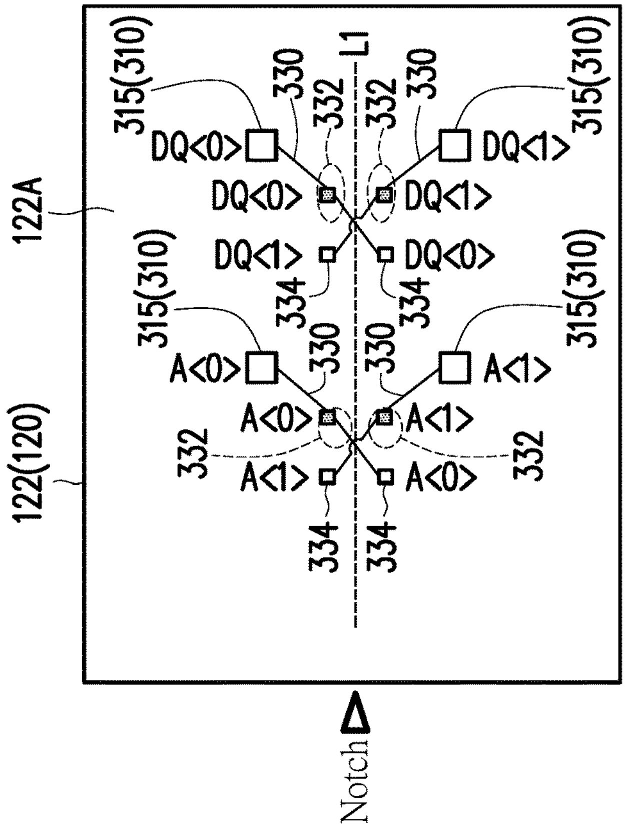

FIG. 3 illustrates a schematic cross-sectional view of a memory tile with a connection structure between two sets of probe pads on two surfaces of the memory tile according to one embodiment of the disclosure. FIGS. 4A and 4B illustrates a schematic front view and back view of a memory tile with a connection structure between two sets of probe pads on two surfaces of the memory tile according to one embodiment of the disclosure.

In FIG. 3, the memory tile 122 is provided on a substrate 300. The substrate 300 for example may be a silicon substrate or other suitable material. The memory tile 122 comprises a plurality of first conductive connections 330, a plurality of second conductive connections 332, a plurality of third conductive connections 334 and a plurality of fourth conductive connections 336. These conductive connections 330, 332, 334 and 336 forms the connection structure to electrically connect the first probe pad set 310 to the second probe pad set 320. The plurality of second conductive connections 332 may further connected to internal memory element 340, such as transistors (for example, serving as memory cells).

Referring to FIGS. 3 and 4A, the number of the plurality of first conductive connections 330 is basically the same as the number of the first probe pads 315 of the first probe pad set 310 on the first surface 122A of the memory tile 122. Each of the plurality of first conductive connections 330 is electrically connected to a corresponding first probe pad 315 among the first probe pad set 310. In one embodiment, the first conductive connections 330 may be implemented by a redistribution layer/line (RDL), i.e., a front RDL. For example, the front RDL (for DQ<0>) 330 is electrically connected to the corresponding first probe pad 315 (for DQ<0>), the front RDL 330 (for A<0>) is electrically connected to the corresponding first probe pad (for A<0>) 315, the front RDL (for DQ<1>) 330 is electrically connected to the corresponding first probe pad (for DQ<1>) 315, and the front RDL (for A<1>) 330 is electrically connected to the corresponding first probe pad (for A<1>) 315.

In FIG. 3, according to the embodiment, each of the plurality of second conductive connections 332 may be formed by a set of multiple metal layers (internal metal layers or interconnection) through which other components of the memory tile 122 can be connected. Also, the number of the plurality of second conductive connections 332 is basically the same as the number of the first conductive connections 330. Each of the plurality of second conductive connections 332 is electrically connected to a corresponding first conductive connection 330 among the plurality of first conductive connections 330. For example, as shown in FIG. 4A, the internal metal layers (for DQ<0>) 332 is electrically connected to the corresponding front RDL (for DQ<0>) 330, the internal metal layers (for A<0>) 332 is electrically connected to the corresponding front RDL (for A<0>) 330, the internal metal layers (for DQ<1>) 332 is electrically connected to the corresponding front RDL (for DQ<1>) 330, and the internal metal layers (for A<1>) 332 is electrically connected to the corresponding front RDL (for A<1>) 330.

Furthermore, as shown in FIG. 4A, for example, the TSV (for DQ<0>) 334 is arranged at the opposite side of the first probe pad (for DQ<0>) 315 with respect to the central line L1. Namely, the first probe pad (for DQ<0>) 315 is arranged at one side of the central line L1, and the TSV (for DQ<0>) 334 is at another side of the central line L1. Then, the TSV (for DQ<0>) 334 and the first probe pad (for DQ<0>) 315 are electrically connected by the front RDL (for DQ<0>) 330 and the internal metal layers (for DQ<0>) 332. By the internal metal layers (for DQ<0>) 332, the first probe pad (for DQ<0>) 315 is electrically connected to the TSV (for DQ<0>) 334 across the central line L1. In addition, as shown in FIG. 4B, when the memory tile 122 is turned up, due to the mirror symmetry, the TSV (for DQ<0>) 334 at the lower side of the central line L1 viewed from the first surface 122A becomes the TSV (for DQ<0>) 334 at the upper side of the central line L2 viewed from the second surface 122B. As a result, the second probe pad 325 and the TSV (for DQ<0>) 334 at the same side can be electrically connected by the fourth conductive connections 336, so that the second probe pad 325 can receive the test signal DQ<0>. Therefore, the test signal pattern of the second probe pad set 320 on the second surface 122B is the same as the test signal pattern of the first probe pad set 310 on the first surface 122A.

In addition, the number of the plurality of third conductive connections 334 is basically the same as the number of the second conductive connections 332. Each of the plurality of the third conductive connections 334 is electrically connected to a corresponding second conductive connections 332 (i.e., internal metal layers). In one embodiment, the third conductive connections 334 may be implemented by a through silicon via (TSV). The TSV 334 can penetrate through the substrate 300 and connect to at least one layer of the corresponding internal metal layers 332. For example, as shown in FIG. 4A, the TSV 334 (for DQ<0>) is electrically connected to the corresponding internal metal layers 332 (for DQ<0>), the TSV 334 (for A<0>) is electrically connected to the corresponding internal metal layers 332 (for A<0>), the TSV 334 (for DQ<1>) is electrically connected to the corresponding internal metal layers 332 (for DQ<1>), and the TSV 334 (for A<1>) is electrically connected to the corresponding internal metal layers 332 (for A<1>).

It should be noted that the TSV 334 (for DQ<0>) is arranged at the side opposite to the first probe pad 315 for DQ<0>. Also, the TSV 334 (for DQ<1>), the TSV 334 (for A<0>) and the TSV 334 (for A<1>) are respectively arranged at the side opposite to the first probe pad 315 for DQ<1>, the first probe pad 315 for A<0> and the first probe pad 315 for A<1>. As shown in FIG. 4A, each of the first probe pads 315 at one side (such as the side above the central line L1) is electrically connected to the corresponding TSV 334 at the other side (such as the side under the central line L1) through the corresponding front RDL 330 and the corresponding internal metal layers 332.

Furthermore, as shown in FIGS. 3 and 4B, the number of the plurality of fourth conductive connections 336 is basically the same as the number of the third conductive connections 334. Each of the plurality of the fourth conductive connections 336 is electrically connected to a corresponding third conductive connections 334 (i.e., the TSV 334). In one embodiment, the fourth conductive connections 336 may be implemented by a redistribution layer/line (RDL), i.e., a back RDL. For example, the back RDL 336 (for DQ<0>) is electrically connected to the corresponding TSV 334 (for DQ<0>) and the corresponding second probe pad 325 (for DQ<0>), the back RDL 336 (for A<0>) is electrically connected to the corresponding TSV 334 (for A<0>) and the corresponding second probe pad 325 (for A<0>), the back RDL 336 (for DQ<1>) is electrically connected to the corresponding TSV 334 (for DQ<1>) and the corresponding second probe pad 325 (for DQ<1>), and the back RDL 336 (for A<1>) is electrically connected to the corresponding TSV 334 (for A<1>) and the corresponding second probe pad (for A<1>) 325.

According to the aforementioned connection structure, as shown in FIGS. 4A and 4B, a test signal pattern of the third conductive connections (TSV) 334 viewed from the first surface 122A of the memory tile 122 and a test signal pattern of the third conductive connections (TSV) 334 viewed from the second surface 122B of the memory tile 122 are a mirror symmetry with respect to the central line L1 or L2. By using the corresponding front RDL 330, the internal metal layers 332, the TSV 334 and the back RDL 336 to connect the first probe pad set 310 and the second probe set 320, when the memory tile 122 (or wafer) is turned up, the test signal pattern of the first probe pad set 310 is the same as the test signal pattern of the second probe pad set 320. As a result, no mater which surface of the memory tile 122 is to be tested, the same probe card can be used.

Figure 5B:
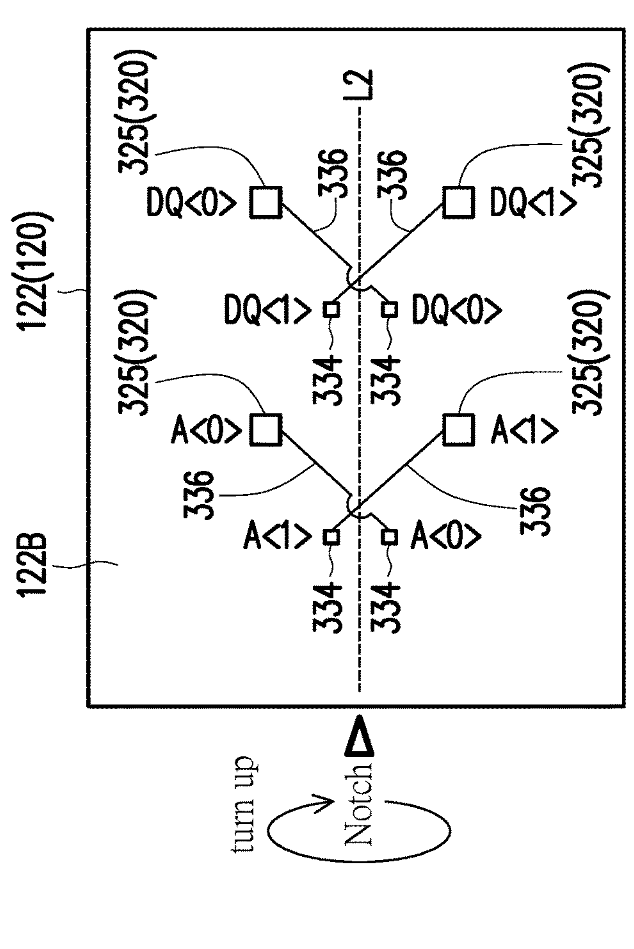
FIGS. 5A and 5B illustrate a variation of a schematic front view and back view of a memory tile with a connection structure shown in FIGS. 4A and 4B.
Figure 5A:
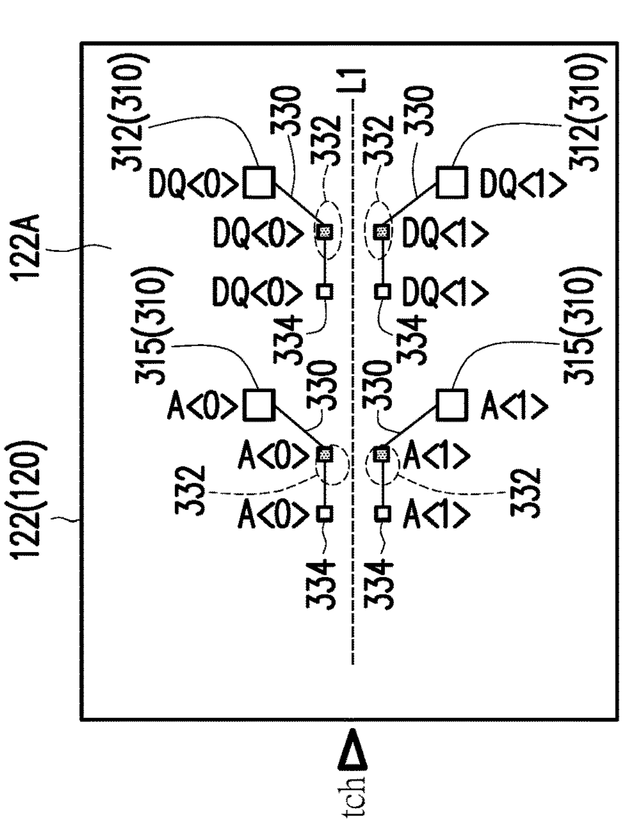

FIGS. 5A and 5B illustrate a variation of a schematic front view and back view of a memory tile with a connection structure shown in FIGS. 4A and 4B. In FIGS. 5A and 5B, the connection configuration of the front RDL 330, the internal metal layers 332, the TSVs 334 and the back RDL 336 are different from FIGS. 4A and 4B. In this configuration, the test signal pattern of the TSVs 334 viewed from the first surface 122A is the same as the test signal pattern of the first probe pad set 310, the test signal pattern of the TSVs 334 viewed from the second surface 122B is reversed to the test signal pattern of the second probe pad set 320 with respect to the central line L2. Although the connection configuration in FIGS. 5A and 5B is different from the connection configuration in FIGS. 4A and 4B, the test signal pattern of the TSVs 334 viewed from the first surface 122A of the memory tile 122 and the test signal pattern of the TSVs 334 viewed from the second surface 122B of the memory tile 122 are still a mirror symmetry with respect to the central line L1 or L2. As a result, when the memory tile 122 (or wafer) is turned up, the test signal pattern of the first probe pad set 310 is the same as the test signal pattern of the second probe pad set 320. As a result, no matter which surface of the memory tile 122 is to be tested, the same probe card can be used.

In summary, according to the connection structure of the embodiment, the arrangement pattern and the test signal pattern of the first probe pad set are the same as the arrangement pattern and the test signal pattern of the second probe pad set. Therefore, when the memory tile is turned up, the back side test can be performed using the same probe card. The testing cost can be reduced and the testing procedure can be more flexible.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory tile with a probe pad arrangement, comprising:

a first surface and a second surface opposite to the first surface;

a first probe pad set, having a plurality of first probe pads and provided on the first surface;

a second probe pad set, having a plurality of second probe pads and provided on the second surface;

a plurality of first conductive connections, each of the plurality of first conductive connections is electrically connected to a corresponding first probe pad among the first probe pad set;

a plurality of second conductive connections, each of the plurality of second conductive connections is electrically connected to a corresponding first conductive connection among the plurality of first conductive connections;

a plurality of third conductive connections, each of the plurality of third conductive connections is electrically connected to a corresponding second conductive connection among the plurality of second conductive connections; and a plurality of fourth conductive connections, each of the plurality of fourth conductive connections is electrically connected to a corresponding third conductive connection among the plurality of third conductive connections and is electrically connected to a corresponding second probe pad among the second probe pad set, wherein a first arrangement pattern of the first probe pad set is the same as a second arrangement pattern of the second probe pad set, the plurality of first probe pads of the first probe pad set each receives a corresponding first test signal to form a first test signal arrangement pattern, and the plurality of second probe pads of the second probe pad set each receives a corresponding second test signal to form a second test signal arrangement pattern, wherein the first test signal arrangement pattern received by the first probe pad set has two rows symmetrically lined up with respect to a first central line, and the second test signal arrangement pattern received by the second probe pad set has two rows symmetrically lined up with respect to a second central line, and the first test signal arrangement pattern on the first surface is the same as the second test signal arrangement pattern on the second surface, such that a same probe card is applied to the first probe pad set and the second probe pad set to test the first surface or the second surface of the memory tile.

2. The memory tile according to claim 1, wherein a test signal pattern of the plurality of third conductive connections viewed from the first surface of the memory tile and a test signal pattern of the plurality of third conductive connections viewed from the second surface of the memory tile are a mirror symmetry.

3. The memory tile according to claim 1, wherein each of the plurality of first conductive connections is a redistribution layer, and each of the plurality of fourth conductive connections is a redistribution layer.

4. The memory tile according to claim 1, wherein each of the plurality of third conductive connections is a through silicon via (TSV).

5. The memory tile according to claim 1, wherein each of the plurality of second conductive connections is constructed by at least one internal metal layer provided in the memory tile.

6. The memory tile according to claim 1, wherein the plurality of first probe pads is arranged in two rows along a central line of the first arrangement pattern of the first probe pad set, and the plurality of second probe pads is arranged in two rows along a central line of the second arrangement pattern of the second probe pad set.

7. The memory tile according to claim 1, wherein the memory tile is a DRAM tile.

8. A stacked memory device, comprising:

a memory chip, having a plurality of memory tiles;

a logic chip, bonded to the memory chip in a face-to-face manner and configured to control the memory chip, wherein each of the plurality of memory tiles further comprises:

a first surface and a second surface opposite to the first surface;

a first probe pad set, having a plurality of first probe pads and provided on the first surface;

a second probe pad set, having a plurality of second probe pads and provided on the second surface;

a plurality of first conductive connections, each of the plurality of first conductive connections is electrically connected to a corresponding first probe pad among the first probe pad set;

a plurality of second conductive connections, each of the plurality of second conductive connections is electrically connected to a corresponding first conductive connection among the plurality of first conductive connections;

a plurality of third conductive connections, each of the plurality of third conductive connections is electrically connected to a corresponding second conductive connection among the plurality of second conductive connections; and a plurality of fourth conductive connections, each of the plurality of fourth conductive connections is electrically connected to a corresponding third conductive connection among the plurality of third conductive connections and is electrically connected to a corresponding second probe pad among the second probe pad set, wherein a first arrangement pattern of the first probe pad set is the same as a second arrangement pattern of the second probe pad set, the plurality of first probe pads of the first probe pad set each receives a corresponding first test signal to form a first test signal arrangement pattern, and the plurality of second probe pads of the second probe pad set each receives a corresponding second test signal to form a second test signal arrangement pattern, wherein the first test signal arrangement pattern received by the first probe pad set has two rows symmetrically lined up with respect to a first central line, and the second test signal arrangement pattern received by the second probe pad set has two rows symmetrically lined up with respect to a second central line, and the first test signal arrangement pattern on the first surface is the same as the second test signal arrangement pattern on the second surface, such that a same probe card is applied to the first probe pad set and the second probe pad set to test the first surface or the second surface of the memory tile.

9. The stacked memory device according to claim 8, wherein a test signal pattern of the plurality of third conductive connections viewed from the first surface of the memory tile and a test signal pattern of the plurality of third conductive connections viewed from the second surface of the memory tile are a mirror symmetry.

10. The stacked memory device according to claim 8, wherein each of the plurality of first conductive connections is a redistribution layer, and each of the plurality of fourth conductive connections is a redistribution layer.

11. The stacked memory device according to claim 8, wherein each of the plurality of third conductive connections is a through silicon via (TSV).

12. The stacked memory device according to claim 8, wherein each of the plurality of second conductive connections is constructed by at least one internal metal layer provided in the memory tile.

13. The stacked memory device according to claim 8, wherein the plurality of first probe pads is arranged in two rows along a central line of the first arrangement pattern of the first probe pad set, and the plurality of second probe pads is arranged in two rows along a central line of the second arrangement pattern of the second probe pad set.

14. The stacked memory device according to claim 8, wherein the memory tile is a DRAM tile.

15. A memory tile with a probe pad arrangement, comprising:

a first surface and a second surface opposite to the first surface;

a first probe pad set, having a plurality of first probe pads and provided on the first surface;

a second probe pad set, having a plurality of second probe pads and provided on the second surface; and a plurality of connection structures, each of the plurality of connection structures being electrically connected to a corresponding first probe pad among the plurality of first probe pads and to a corresponding second probe pad among the plurality of second probe pads, wherein a first arrangement pattern of the first probe pad set is the same as a second arrangement pattern of the second probe pad set, the plurality of first probe pads of the first probe pad set each receives a corresponding first test signal to form a first test signal arrangement pattern, and the plurality of second probe pads of the second probe pad set each receives a corresponding second test signal to form a second test signal arrangement pattern, wherein the first test signal arrangement pattern received by the first probe pad set has two rows symmetrically lined up with respect to a first central line, and the second test signal arrangement pattern received by the second probe pad set has two rows symmetrically lined up with respect to a second central line, and the first test signal arrangement pattern on the first surface is the same as the second test signal arrangement pattern on the second surface, such that a same probe card is applied to the first probe pad set and the second probe pad set to test the first surface or the second surface of the memory tile.

16. The memory tile according to claim 15, wherein each of the plurality of connection structures comprises:

a first redistribution layer, electrically connected to the corresponding first probe pad;

an interconnection, electrically connected to the first redistribution layer;

a through silicon via (TSV), electrically connected to the interconnection; and a second redistribution layer, electrically connected to the TSV and to the corresponding second probe pad.

17. The memory tile according to claim 16, wherein the interconnection comprises a plurality of internal metal layers provided in the memory tile.

18. The memory tile according to claim 16, wherein a test signal pattern of the TSVs viewed from the first surface of the memory tile and a test signal pattern of the TSVs viewed from the second surface of the memory tile are a mirror symmetry.

19. The memory tile according to claim 15, wherein the plurality of first probe pads is arranged in two rows along a central line of the first arrangement pattern of the first probe pad set, and the plurality of second probe pads is arranged in two rows along a central line of the second arrangement pattern of the second probe pad set.

20. The memory tile according to claim 15, wherein the memory tile is a DRAM tile.

* * * * *